(12) United States Patent
Senoo (10) Patent No.: US 8,967,857 B2
(45) Date of Patent: Mar. 3, 2015

(54) TEMPERATURE DETECTION DEVICE THAT DETECTS TEMPERATURE OF ROTOR OF MOTOR

(75) Inventor: Tatsuya Senoo, Yamanashi (JP)

(73) Assignee: Fanuc Corporation, Yamanashi (JP)

( * ) Notice: Subject to any disclaimer, the term of this patent is extended or adjusted under 35 U.S.C. 154(b) by 319 days.

(21) Appl. No.: 13/524,114

(22) Filed: Jun. 15, 2012

(65) Prior Publication Data

US 2013/0028292 A1    Jan. 31, 2013

(30) Foreign Application Priority Data

Jul. 29, 2011  (JP) ................. 2011-167677

(51) Int. Cl.
| | |
|---|---|
| *G01K 13/08* | (2006.01) |
| *G01K 1/00* | (2006.01) |
| *G01K 7/00* | (2006.01) |
| *H02P 9/12* | (2006.01) |
| *G01K 13/00* | (2006.01) |
| *H02P 29/00* | (2006.01) |
| *G01R 31/34* | (2006.01) |

(52) U.S. Cl.
CPC ........ *G01K 13/00* (2013.01); *G01K 7/00* (2013.01); *H02P 29/0044* (2013.01); *G01R 31/343* (2013.01)
USPC ........... 374/141; 374/153; 374/163; 374/183; 415/47; 702/130; 322/51

(58) Field of Classification Search
CPC ......... H02K 21/24; H02K 3/28; H02K 1/148; H02K 16/02; H02K 16/04; H02K 19/00
USPC ......... 374/141, 144, 184, 185, 183, 152, 163, 374/142, 143, 4, 5, 57; 322/33, 49, 51; 702/130, 136; 415/47
See application file for complete search history.

(56) References Cited

U.S. PATENT DOCUMENTS

| | | | | | |
|---|---|---|---|---|---|
| 2,803,786 | A | * | 8/1957 | Edsall | ............................. 361/94 |
| 3,357,807 | A | * | 12/1967 | Stalego | ............................ 65/475 |
| 5,594,670 | A | * | 1/1997 | Yamamoto | ..................... 702/64 |
| 5,650,706 | A | | 7/1997 | Yamada et al. | |

(Continued)

FOREIGN PATENT DOCUMENTS

| | | | |
|---|---|---|---|
| CN | 101055294 A | | 10/2007 |
| CN | 101266183 A | * | 9/2008 |

(Continued)

OTHER PUBLICATIONS

Office Action dated Nov. 25, 2013, corresponds to German patent application No. 102012014320.6.

(Continued)

*Primary Examiner* — Gail Kaplan Verbitsky
(74) *Attorney, Agent, or Firm* — Lowe Hauptman & Ham, LLP (57) ABSTRACT

A temperature detection device that detects a temperature of a rotor of a motor. The temperature detection device has a current detection unit configured to detect a current value of a current flowing through a winding with which any one of a stator and the rotor of the motor is provided, an iron loss estimation unit configured to estimate an iron loss of the rotor using the current value, and a rotor temperature estimation unit configured to estimate the temperature of the rotor using the iron loss.

8 Claims, 7 Drawing Sheets

(56) References Cited

U.S. PATENT DOCUMENTS

| | | | |
|---|---|---|---|
| 6,043,632 A * | 3/2000 | Maehara et al. | 322/28 |
| 6,700,400 B2 * | 3/2004 | Atarashi | 318/400.01 |
| 6,894,413 B2 * | 5/2005 | Nakano et al. | 310/156.01 |
| 7,408,312 B2 | 8/2008 | Itou et al. | |
| 7,498,775 B2 | 3/2009 | Swahn et al. | |
| 8,080,908 B2 * | 12/2011 | Matsubara et al. | 310/61 |
| 8,358,095 B2 | 1/2013 | Savagian et al. | |
| 8,762,116 B2 * | 6/2014 | Yeh et al. | 703/8 |
| 2004/0257011 A1 | 12/2004 | Rechberger | |
| 2006/0119312 A1 | 6/2006 | Okamura et al. | |
| 2006/0125344 A1 * | 6/2006 | Yokota et al. | 310/264 |
| 2007/0024248 A1 * | 2/2007 | Umeda et al. | 322/37 |
| 2008/0319702 A1 * | 12/2008 | Kallesoe et al. | 702/130 |
| 2009/0033260 A1 | 2/2009 | Fernengel et al. | |
| 2009/0261667 A1 * | 10/2009 | Matsubara et al. | 310/54 |
| 2010/0090629 A1 * | 4/2010 | Tang | 318/400.09 |
| 2011/0279074 A1 * | 11/2011 | Yeh et al. | 318/432 |
| 2012/0146683 A1 * | 6/2012 | Tanimoto et al. | 324/765.01 |
| 2012/0153749 A1 * | 6/2012 | Chun et al. | 310/59 |
| 2012/0271606 A1 * | 10/2012 | Yeh et al. | 703/7 |
| 2012/0299521 A1 * | 11/2012 | Petersson et al. | 318/490 |
| 2013/0090791 A1 * | 4/2013 | Yeh et al. | 701/22 |
| 2013/0207488 A1 * | 8/2013 | Labbe et al. | 310/43 |
| 2013/0294888 A1 * | 11/2013 | Yokoyama et al. | 415/47 |

FOREIGN PATENT DOCUMENTS

| | | | |
|---|---|---|---|
| CN | 101769797 A * | 7/2010 | |
| CN | 201629618 U * | 11/2010 | |
| CN | 101988953 A | 3/2011 | |
| DE | 10218538 A1 | 11/2002 | |
| DE | 10212751 A1 | 10/2003 | |
| DE | 102005026439 A1 | 12/2006 | |
| DE | 102009038245 A1 | 5/2010 | |
| DE | 102009057433 A1 | 8/2010 | |
| EP | 1220439 A2 * | 7/2002 | |
| JP | 57083185 A * | 5/1982 | |
| JP | 03060359 A * | 3/1991 | |
| JP | 08275442 A * | 10/1996 | |
| JP | 2000-205972 A | 7/2000 | |
| JP | 2004023930 A * | 1/2004 | |
| JP | 2006-501793 A | 1/2006 | |
| JP | 2006-94576 A | 4/2006 | |
| JP | 2007-336708 A | 12/2007 | |
| JP | 2009-11054 A | 1/2009 | |
| JP | 2009261078 A | 11/2009 | |
| JP | 2010-268644 A | 11/2010 | |

OTHER PUBLICATIONS

A JP Office Action, dated Aug. 28, 2012, issued in JP Application No. 2011-167677.

Corresponding German Application No. 10 2012 014 320.6 Office Action dated May 14, 2013.

Office Action mailed Jul. 10, 2013 corresponds to Chinese patent application No. 201210262697.0.

* cited by examiner

TEMPERATURE DETECTION DEVICE THAT DETECTS TEMPERATURE OF ROTOR OF MOTOR

RELATED APPLICATIONS

The present application is based on, and claims priority from, Japanese Application Number 2011-167677, filed Jul. 29, 2011, the disclosure of which is hereby incorporated by reference herein in its entirety.

BACKGROUND OF THE INVENTION

1. Field of the Invention

The present invention relates to a temperature detection device that detects a temperature of a rotor of a motor in order to protect the rotor from overheating.

2. Description of Related Art

Conventionally, in a temperature detection device configured to protect a motor having a stator and a rotor from overheating, a temperature of a winding is detected by a temperature detection element, such as a thermistor and a thermostat, attached near the winding of the stator and when the detected temperature exceeds a predetermined value, an alarm signal is generated.

Further, a temperature detection device that takes into consideration motor loss in addition to temperature detected by a temperature detector when detecting the temperature of a winding to protect a motor from overheating is also proposed in, for example, Japanese Unexamined Patent Publication (Kokai) No. 2009-261078 (JP2009-261078A).

However, the conventional temperature detection device is configured to protect a winding from overheating and not protect a rotor from overheating. For example, when a rotor of a synchronous motor rotates at high speed, the amount of heat generated in the rotor is excessive and the stator is cooled down forcedly, and therefore, there is a case where the temperature of the rotor becomes remarkably higher than the temperature of the stator. If the temperature of the rotor becomes remarkably higher than the temperature of the stator as described above, there is a problem of causing conduction of heat to a driven object, such as a work and a tool, attached to the motor and there is a problem of causing demagnetization or degaussing of a permanent magnet when the rotor has a permanent magnet.

In order to avoid such a problem, it is necessary to protect not only the winding but also the rotor from overheating. However, the temperature detector, such as a thermistor and a thermostat, performs wired communication, and therefore, it is difficult to incorporate a temperature detector in a rotor in order to detect the temperature of the rotor.

SUMMARY OF THE INVENTION

As an aspect, the present invention provides a temperature detection device capable of detecting the temperature of a rotor of a motor in order to protect the rotor from overheating.

According to an aspect of the present invention, the temperature detection device that detects a temperature of a rotor of a motor and has a current detection unit configured to detect a current value of a winding provided to one of a stator and the rotor of the motor; an iron loss estimation unit configured to estimate an iron loss of the rotor using the current value; and a rotor temperature estimation unit configured to estimate the temperature of the rotor using the iron loss.

Preferably, the temperature detection device further has a winding temperature estimation unit configured to estimate the temperature of a winding and the rotor temperature estimation unit estimates the temperature of the rotor using the iron loss and the temperature of the winding.

Preferably, the stator is provided with the winding and the winding temperature estimation unit is a temperature detection element arranged on the periphery of the winding.

Preferably, the winding temperature estimation unit estimates a copper loss of the winding from the current value and estimates an amount of rise in the temperature of the winding from the copper loss.

Preferably, the stator is provided with three windings to which U-phase, V-phase and W-phase alternating currents of three-phase alternating currents are supplied, respectively, and the iron loss estimation unit estimates the iron loss of the rotor based on the following equation:

$$p=\{a|I_q|^\alpha+b|c+I_d|^\alpha\}\omega^2+\{e|I_q|^\beta+f|c+I_d|^\beta\}\omega$$

p: Iron loss of the rotor
ω: Frequency of an alternating current flowing through the winding
$I_d$: D-phase alternating current value when three-phase alternating current values are dq-converted into two-phase alternating current values
$I_q$: Q-phase alternating current value when three-phase alternating current values are dq-converted into two-phase alternating current values
a, b, c, e, f: Constant
α, β: Exponent Preferably, the stator is provided with three windings to which the U-phase, V-phase, and W-phase alternating currents of the three-phase alternating currents are supplied, respectively, and the iron loss estimation unit estimates the iron loss of the rotor based on the following equation:

$$p=\{a|I_q|^\alpha+b|c+I_d|^\alpha\}\omega^2+\{e|I_q|^\beta+f|c+I_d|^\beta\}\omega$$

p: Iron loss of the rotor
ω: Frequency of the alternating current flowing through the winding
$I_d$: D-phase alternating current value when three-phase alternating current values are dq-converted into two-phase alternating current values
$I_q$: Q-phase alternating current value when three-phase alternating current values are dq-converted into two-phase alternating current values
a, b, c, e, f: Constant
α, β: Exponent
and the rotor temperature estimation unit estimates an amount of rise in the temperature of the rotor using the iron loss, the temperature of the winding and the temperature of the rotor.

Preferably, the temperature detection device further has an alarm generation unit configured to generate an alarm when the temperature estimated by the rotor temperature estimation unit exceeds a predetermined temperature.

Preferably, the motor is a synchronous motor.

According to an aspect of the present invention, it is possible to detect the temperature of a rotor in order to protect the rotor of the motor from overheat by detecting a current value of a winding, estimating an iron loss of the rotor using the current value, and estimating the temperature of the rotor using the iron loss.

BRIEF DESCRIPTION OF THE DRAWINGS

The objects, features, and advantages of the present invention will be made clearer by the description of the following embodiments relating to the accompanying drawings.

DETAILED DESCRIPTION

Embodiments of a temperature detection device according to the present invention are explained with reference to the drawings. In the drawings, the same symbol is attached to the same component.

Figure 1:
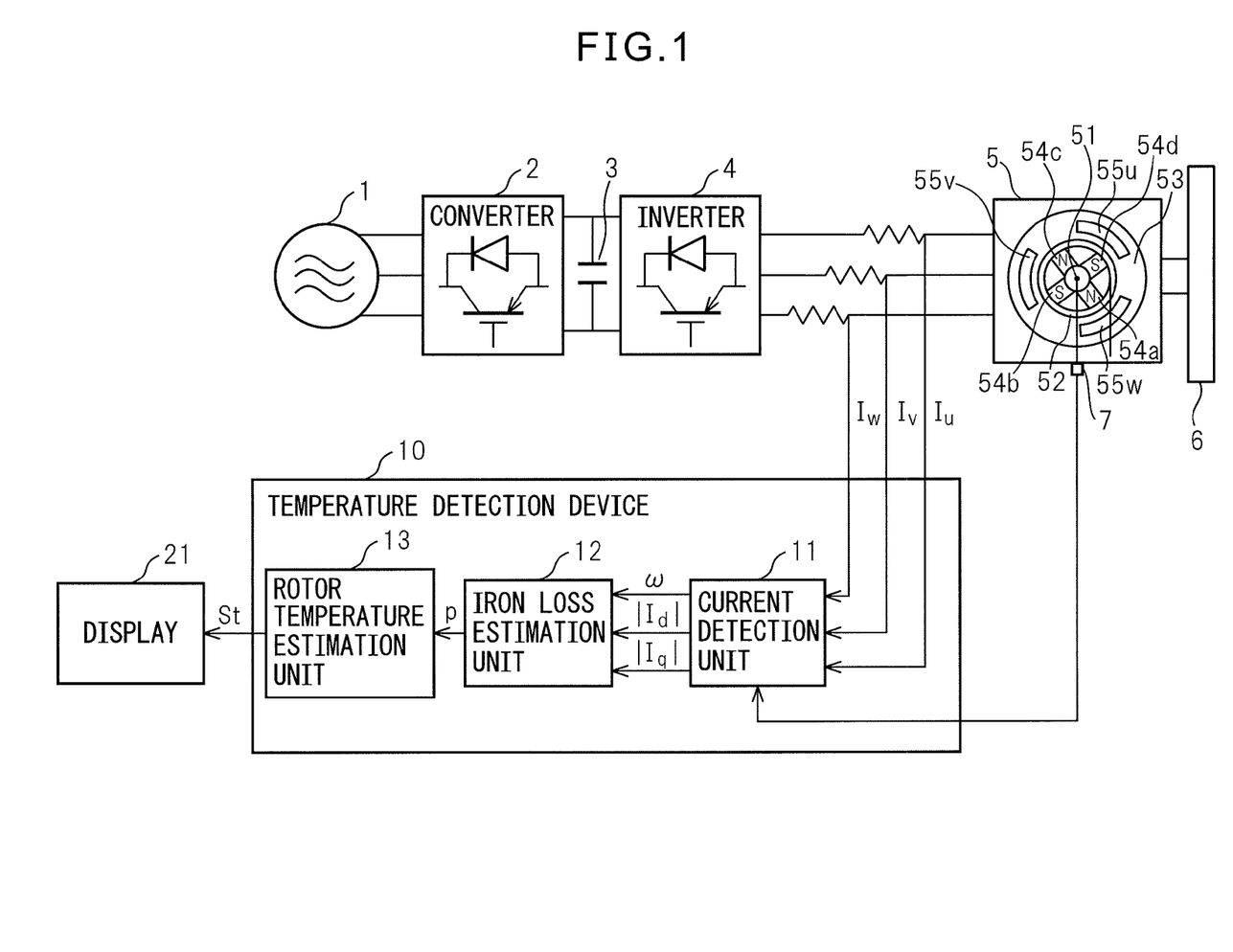
FIG. 1 is a block diagram of a system having a temperature detection device of a first embodiment of the present invention.

Referring to the drawings, FIG. 1 is a block diagram of a system having a temperature detection device of a first embodiment of the present invention. The system shown in FIG. 1 has a three-phase AC power source 1, a converter 2, a smoothing capacitor 3, an inverter 4, a permanent magnet synchronous motor 5, a driven object 6, an encoder 7, a temperature detection device 10 and a display 21.

The converter 2 includes, for example, a plurality (six, in the case of three-phase AC) of rectifier diodes and transistors connected in inverse parallel to the rectifier diodes, respectively, and converts AC power supplied from the three-phase AC power source 1 into DC power. The smoothing capacitor 3 is connected in parallel to the converter 2 in order to smooth a voltage rectified by the rectifier diode of the converter 2. The inverter 4 is connected in parallel to the smoothing capacitor 3 and includes, for example, a plurality (six in the case of three-phase AC) of rectifier diodes and transistors connected in inverse parallel to the rectifier diodes, respectively, and converts the DC power into which converted by the converter 2 into AC power.

The permanent magnet synchronous motor 5 may be any motor to which the driven object 6, such as a table connected to the permanent magnet synchronous motor 5, an arm connected thereto, and a work attached thereto and detached therefrom, is connected and which is configured to change the position and attitude of the table that holds the work in a machine tool or to rotate and operate an arm of a robot, etc. In the present embodiment, the permanent magnet synchronous motor 5 is a rotary servomotor including a rotor 52 as a rotor having a rotating shaft 51 to which the encoder 7 is attached and a stator 53 as a stator arranged so as to surround the rotor 52.

The rotor 52 has four permanent magnets 54a, 54b, 54c, and 54d arranged at 90° intervals. The permanent magnets 54a, 54b, 54c, and 54d are arranged so that the end parts thereof on the side of the stator 53 are separated 90° from one another in the rotation direction of the rotor 52 and the end parts on the outside of the permanent magnets 54a, 54b, 54c, and 54d are alternately the N pole, S pole, N pole, and S pole.

The stator 53 has three windings 55u, 55v, and 55w arranged at 120° intervals and to which the U-phase, V-phase, and W-phase alternating currents are supplied, respectively. Consequently, the permanent magnet synchronous motor 3 functions as a three-phase synchronous motor.

The temperature detection device 10 detects a temperature $T_r$ of the rotor 52, as described later in detail. To do this, the temperature detection device 10 has a current detection unit 11, an iron loss estimation unit 12 and a rotor temperature estimation unit 13.

The current detection unit 11 detects a U-phase alternating current value $I_u$ flowing through the winding 55u, a V-phase alternating current value $I_v$ flowing through the winding 55v, and a W-phase alternating current value $I_w$ flowing through the winding 55w. Then, the current detection unit 11 calculates a frequency ω of the U-phase alternating current, the V-phase alternating current and the W-phase alternating current, an amplitude value $|I_d|$ of the D-phase alternating current (D-phase direct current value) and an amplitude value $|I_q|$ of the Q-phase alternating current (Q-phase direct current value), based on the detected U-phase alternating current value $I_u$, the detected V-phase alternating current value $I_v$ and the detected W-phase alternating current value $I_w$, and supplies the frequency ω, the amplitude value $|I_d|$ of the D-phase alternating current and an amplitude value $|I_q|$ to the iron loss estimation unit 12. To do this, the current detection unit 11 includes, for example, an A/D converter that converts the U-phase alternating current value $I_u$, the V-phase alternating current value $I_v$ and the W-phase alternating current value $I_w$ into the U-phase direct current value $|I_u|$, the V-phase direct current value $|I_v|$, and the W-phase direct current value $|I_w|$, respectively, an excitation phase acquisition unit configured to acquire an excitation phase from the phase of the position of the rotor detected by the encoder 7, a three-phase to two-phase converter configured to convert the U-phase direct current value $|I_u|$, the V-phase direct current value $|I_v|$ and the W-phase direct current value $|I_w|$ into the D-phase direct current value $|I_d|$ and the Q-phase direct current value $|I_q|$ using a three-phase to two-phase conversion matrix, etc.

The iron loss estimation unit 12 estimates the iron loss p of the rotor 52 based on the following equation:

$$p = \{a|I_q|^\alpha + b|c+I_d|^\alpha\}\omega^2 + \{e|I_q|^\beta + f|c+I_d|^\beta\}\omega \quad (1)$$

p: Iron loss

ω: Frequency of an alternating current flowing through the winding $I_d$: D-phase alternating current value when three-phase alternating current values are dq-converted into two-phase alternating current values $I_q$: Q-phase alternating current value when three-phase alternating current values are dq-converted into two-phase alternating current values a, b, c, e, f: Constant α, β: Exponent and supplies the iron loss p to the rotor temperature estimation unit 13.

In equation (1), the first term corresponds to a loss caused by an eddy current and the second term corresponds to a loss caused by hysteresis. When determining the constants a, b, c, e, f, α, and β, the iron loss p is calculated while varying the D-phase alternating current value $I_d$ and the Q-phase alternating current value $I_q$ in the measurement of the iron loss p, a simulation (for example, magnetic analysis), etc., and the constants a, b, c, e, f, α, and β are selected so that the residual between the iron loss p that is calculated and equation (1) is a minimum. When it is difficult to calculate the constants a, b, c, e, and f because the exponents α and β are not determined, it may also be possible to select the values of given exponents α and β (for example, α=2, β=1.6) in advance and to calculate only the constants a, b, c, e, and f. Note that $bc^\alpha\omega^2+fc^\beta\omega$ corresponding to the iron loss p when $I_d=I_q=0$ is an iron loss resulting from the magnetic flux variations produced by the movement of the rotor 52. Further, when the loss caused by hysteresis is very small, it is possible to ignore the second term.

The rotor temperature estimation unit 13 estimates the temperature $T_r$ of the rotor 52 based on the following equation:

$$T_r(t+\Delta t) = T_r(t) + \frac{P(t) - k(T_r(t) - T_s)}{C}\Delta t \quad (2)$$

t, Δt, t+Δt: Time during which an alternating current is applied to the motor
$T_r(t)$: Temperature of the rotor at time t
$T_r(t+\Delta t)$: Temperature of the rotor at time t+Δt
p(t): Iron loss at time t
$T_s$: Ambient temperature of the motor
k, C: Constants determined by a shape and material of the motor and cooling conditions of the stator
and outputs a video signal $S_t$ relating to the temperature $T_r$ to the display 21. In this case, $T_r(0)=T_s$. Further, according to equation (2), it is possible to estimate an amount of a rise in the temperature $T_r$ of the rotor 52.

In order to estimate the temperature $T_r$ of the rotor 52, it is necessary to determine the initial value $T_r(0)$ of the temperature of the rotor 52. In equation (2), the initial value $T_r(0)$ of the temperature of the rotor 52 is an ambient temperature $T_s$ of the permanent magnet synchronous motor 5, however, it may also be possible to set the initial value $T_r(0)$ of the temperature of the rotor 52 to the initial value of the temperature of the windings 55u, 55v, and 55w or the temperature of the rotor 52 directly measured.

The display 21 includes a liquid crystal display device (LCD) etc., and displays the video signal $S_t$ and calls user's attention to the temperature $T_r$ of the rotor 52. By calling an user's attention in this manner, it is possible to control the operation of the permanent magnet synchronous motor 5 by the operation of the permanent magnet synchronous motor 5 by the user in order to protect the rotor 52 from overheat.

Figure 2:
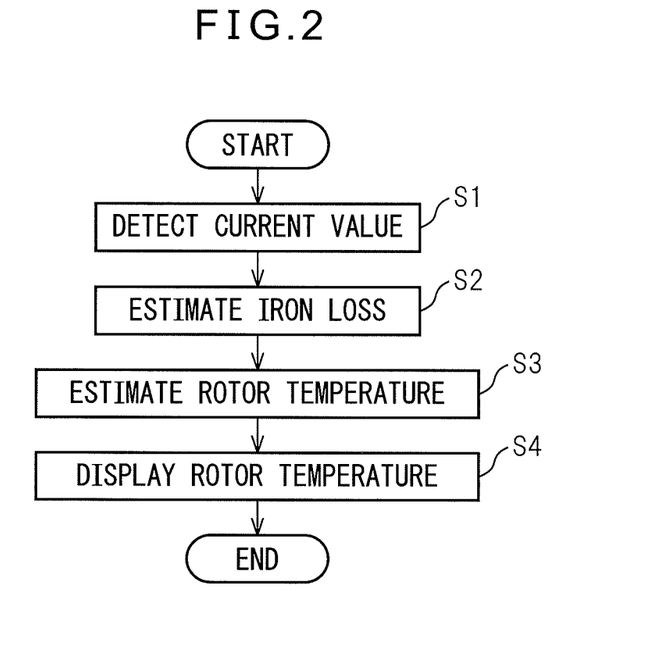
FIG. 2 is a flowchart of an operation of the temperature detection device of the first embodiment of the present invention.

FIG. 2 is a flowchart of the operation of the temperature detection device of the first embodiment of the present invention. First, in step 51, the current detection unit 11 detects the U-phase alternating current value $I_u$, the V-phase alternating current value $I_v$, and the W-phase alternating current value $I_w$, then calculates a frequency ω of the U-phase alternating current, the V-phase alternating current and the W-phase alternating current, an amplitude value $|I_d|$ of the D-phase alternating current (D-phase direct current value) and an amplitude value $|I_q|$ of the Q-phase alternating current (Q-phase direct current value), based on the detected U-phase alternating current value $I_u$, the detected V-phase alternating current value $I_v$ and the detected W-phase alternating current value $I_w$, and supplies the frequency co, the amplitude value $|I_d|$ of the D-phase alternating current and an amplitude value $|I_q|$ to the iron loss estimation unit 12.

Next, in step S2, the iron loss estimation unit 12 estimates the iron loss p based on equation (1) and supplies the iron loss p to the rotor temperature estimation unit 13. Next, in step S3, the rotor temperature estimation unit 13 estimates the temperature $T_r$ of the rotor 52 based on equation (2) and outputs the video signal $S_t$ relating to the temperature $T_r$ to the display 21. Next, in step S4, the display 21 displays the video signal $S_t$ and the processing is exited. According to the present embodiment, by detecting the U-phase alternating current value $I_u$, the V-phase alternating current value $I_v$ and the W-phase alternating current value $I_w$, estimating the iron loss p of the rotor 52 using the U-phase alternating current value $I_u$, the V-phase alternating current value $I_v$ and the W-phase alternating current value $I_w$ and estimating the temperature $T_r$ of the rotor 52 using the iron loss p, it is possible to detect the temperature $T_r$ of the rotor 52 in order to protect the rotor 52 from overheat.

Figure 3:
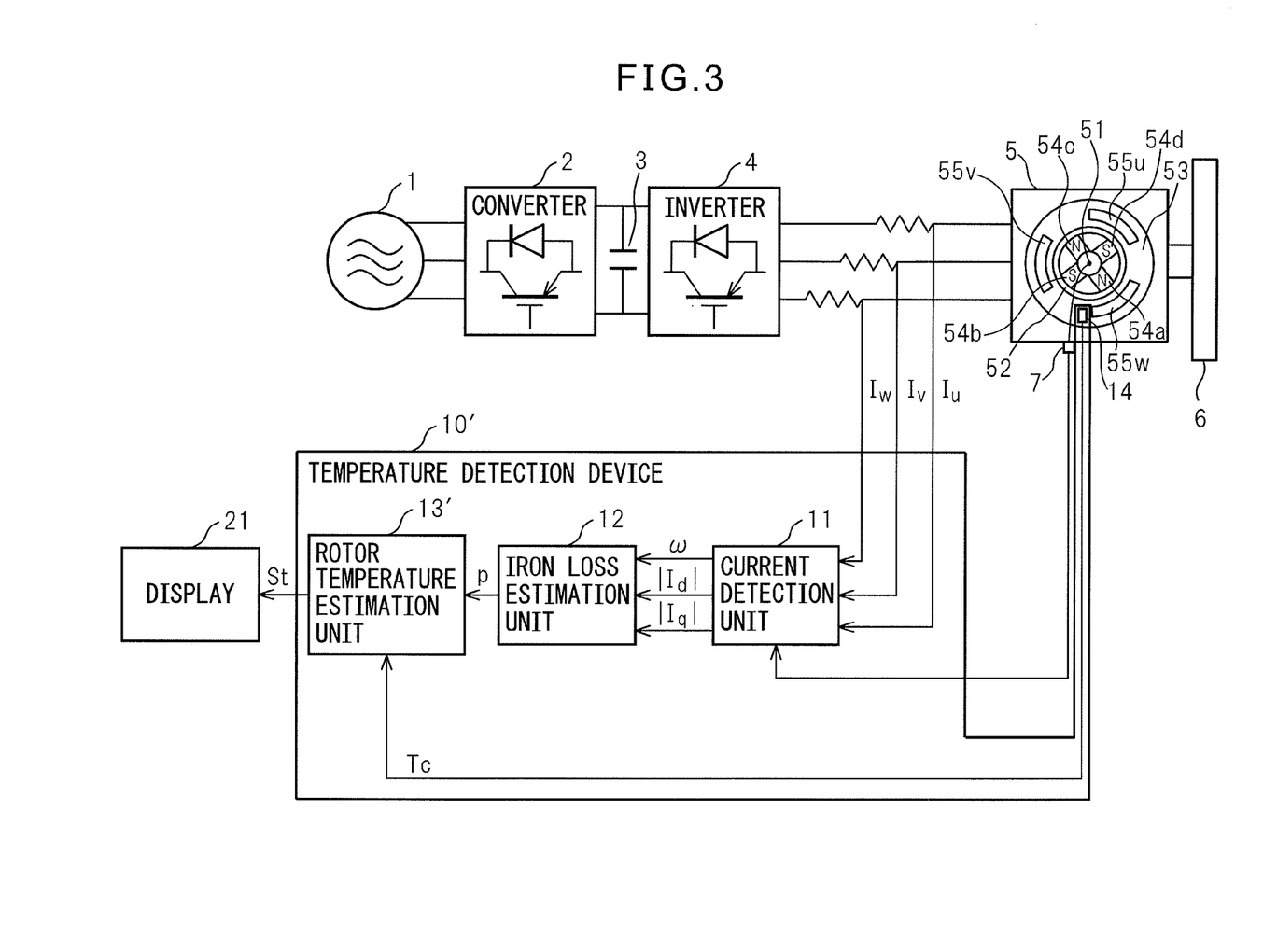
FIG. 3 is a block diagram of a system having a temperature detection device of a second embodiment of the present invention.

FIG. 3 is a block diagram of a system having a temperature detection device of a second embodiment of the present invention. The system shown in FIG. 3 has the three-phase AC power source 1, the converter 2, the smoothing capacitor 3, the inverter 4, the permanent magnet synchronous motor 5, the driven object 6, a temperature detection device 10' and the display 21. The temperature detection device 10' has the current detection unit 11, the iron loss estimation unit 12, a rotor temperature estimation unit 13' and a winding temperature estimation unit 14.

The winding temperature estimation unit 14 is a temperature detection element, such as a thermistor and thermostat, arranged on the periphery of the windings 55u, 55v, and 55w. Consequently, the winding temperature estimation unit 14 directly measures a temperature $T_c$ of the windings 55u, 55v, and 55w.

The rotor temperature estimation unit 13' estimates the temperature $T_r$ of the rotor 52 based on the following equation:

$$T_r(t+\Delta t) = T_r(t) + \frac{P(t) + k_1(T_c(t) - T_r(t)) - k_2(T_r(t) - T_s)}{C}\Delta t \quad (3)$$

t, Δt, t+Δt: Time during which an alternating current is applied to the motor
$T_r(t)$: Temperature of the rotor at time t
$T_r(t+\Delta t)$: Temperature of the rotor at time t+Δt
$T_s(t)$: Temperature of the winding at time t
p(t): Iron loss at time t
$T_s$: Ambient temperature of the motor
$k_1$, $k_2$, C: Constant determined by a shape and material of the motor and cooling conditions of the stator
and outputs the video signal $S_t$ relating to the temperature $T_r$ to the display 21. Equation (3) indicates that the amount of heat generated in the rotor 52 corresponds to the sum of the iron loss and heat transferred from the stator 53 from which the amount of heat dissipated to the atmosphere is subtracted.

When the temperature of the stator 53 is higher than the temperature of the rotor 52, heat is transferred from the stator 53 to the rotor 52. According to equation (3), heat transferred from the stator 53 to the rotor 52 is taken into account by using the temperature $T_c$ of the winding corresponding to the temperature of the stator 53, and therefore, it is possible to estimate the temperature $T_r$ of the rotor 52 with a precision higher than that in the case of equation (2). Further, according to equation (3), it is also possible to estimate an amount of rise in the temperature $T_r$ of the rotor 52.

Figure 4:
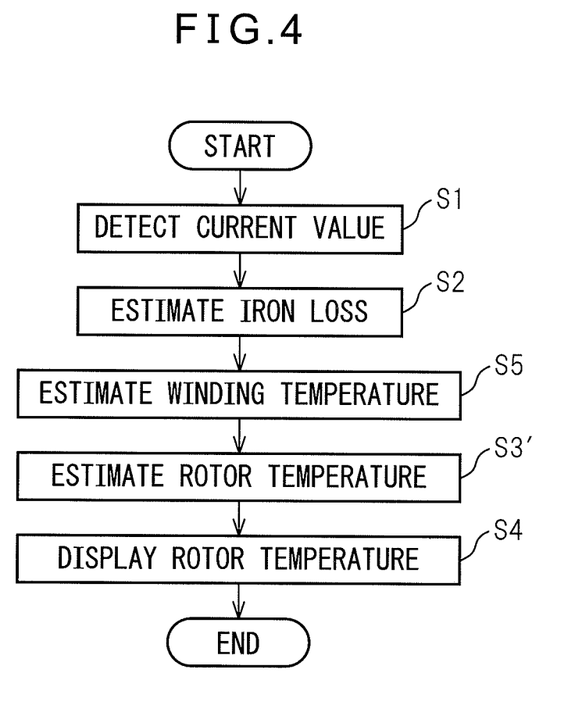
FIG. 4 is a flowchart of an operation of the temperature detection device of the second embodiment of the present invention.

FIG. 4 is a flowchart of the operation of the temperature detection device of the second embodiment of the present invention. In the flowchart in FIG. 4, in step S5 after step S2, the winding temperature estimation unit 14 directly measures the temperature $T_c$ of the windings 55u, 55v, and 55w. Next, in step S3', the rotor temperature estimation unit 13' estimates the temperature $T_r$ of the rotor 52 based on equation (3) and the procedure proceeds to step S4.

Figure 5:
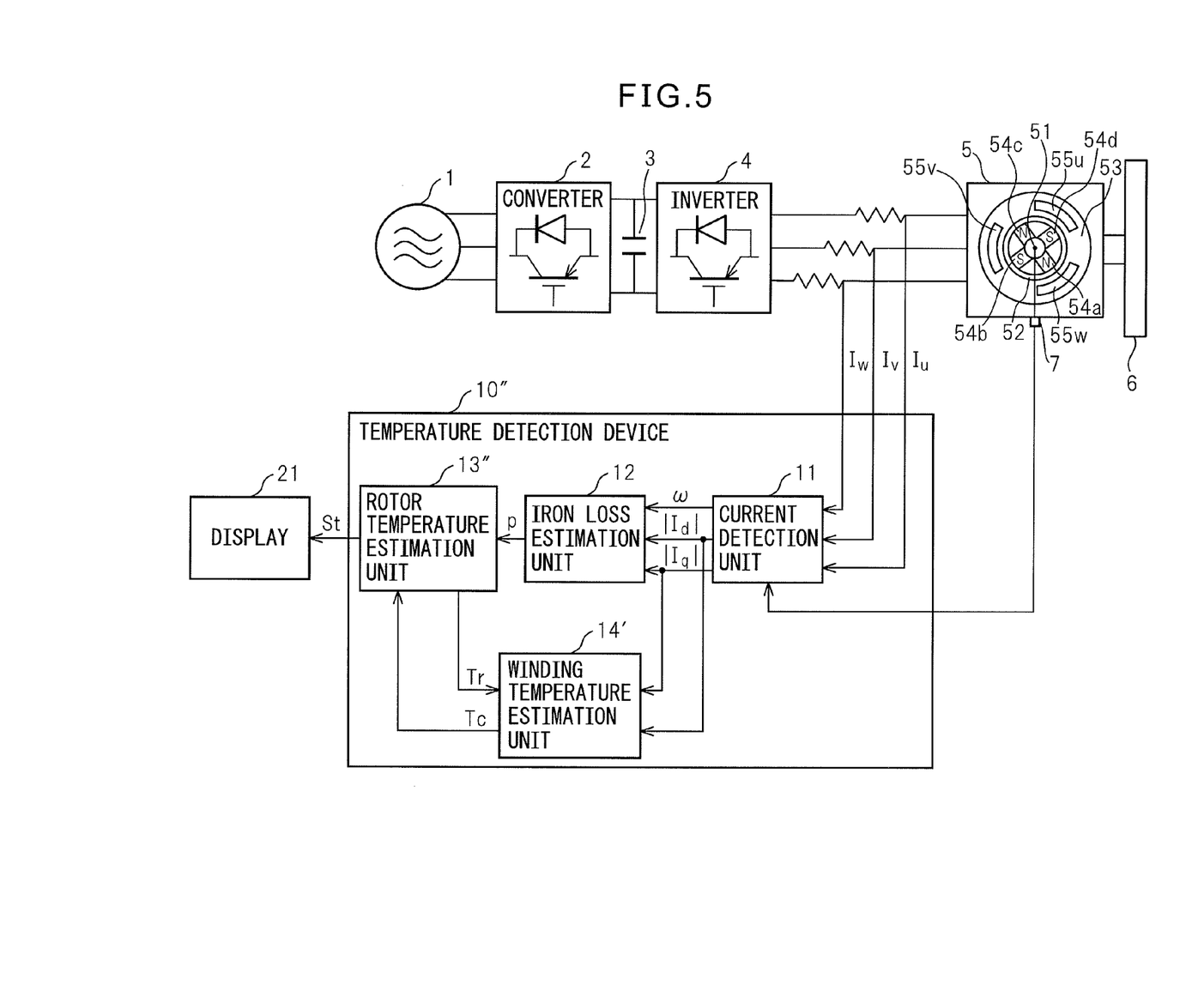
FIG. 5 is a block diagram of a system having a temperature detection device of a third embodiment of the present invention.

FIG. 5 is a block diagram of a system having a temperature detection device of a third embodiment of the present invention. The system shown in FIG. 5 has the three-phase AC power source 1, the converter 2, the smoothing capacitor 3, the inverter 4, the permanent magnet synchronous motor 5, the driven object 6, a temperature detection device 10'' and the display 21. The temperature detection device 10'' has the current detection unit 11, the iron loss estimation unit 12, a rotor temperature estimation unit 13'' and a winding temperature estimation unit 14'.

The winding temperature estimation unit 14' estimates the temperature $T_c$ of the windings 55u, 55v and 55w based on the following equation:

$$T_c(t + \Delta t) = T_c(t) + \frac{Q(t) - k_1(T_c(t) - T_s) + k_2(T_r(t) - T_c(t))}{C} \Delta t \quad (4)$$

t, $\Delta t$, t+$\Delta t$: Time during which an alternating current is applied to the motor
$T_c(t)$: Temperature of the winding at time t
$T_r(t+\Delta t)$: Temperature of the winding at time t+$\Delta t$
$T_r(t)$: Temperature of the rotor at time t
Q(t): Iron loss at time t
$T_s$: Ambient temperature of the motor
$k_1$, $k_2$, C: Constant determined by a shape and material of the motor and cooling conditions of the stator
and supplies the temperature $T_c$ to the rotor temperature estimation unit 13''. The copper loss Q (t) is determined based on the amplitude value of the D-phase alternating current (D-phase direct current value) $|I_d|$, the amplitude value of the Q-phase alternating current (Q-phase direct current value) $|I_q|$, the resistance values of the windings 55u, 55v, and 55w, and the time during which an alternating current is applied to the permanent magnet synchronous motor 5. Further, according to equation (4), it is also possible to estimate an amount of a rise in the temperature $T_c$ of the windings 55u, 55v, and 55w.

In order for the winding temperature estimation unit 14' to estimate the temperature $T_c$ of the windings 55u, 55v, and 55w using the temperature $T_r$ of the rotor 52, the temperature $T_r$ of the rotor 52 is supplied to the winding temperature estimation unit 14' from the rotor temperature estimation unit 13''. Further, the temperature detection device 10'' estimates the temperature $T_r$ of the rotor 52 by performing the same processing as the processing of the flowchart shown in FIG. 4 and displays the video signal $S_t$ on the display 21.

Figure 6:
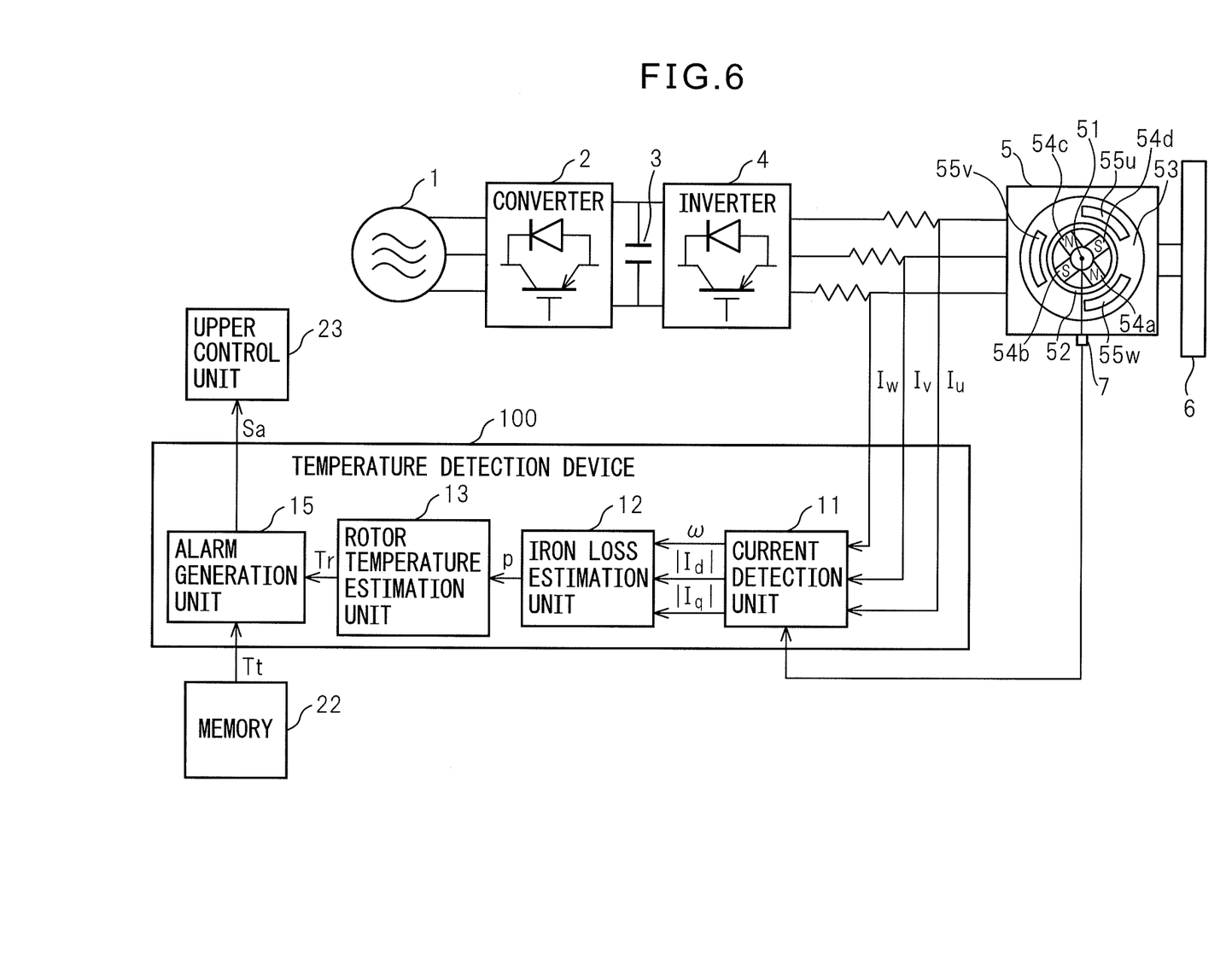
FIG. 6 is a block diagram of a system having a temperature detection device of a fourth embodiment of the present invention.

FIG. 6 is a block diagram of a system having a temperature detection device of a fourth embodiment of the present invention. The system shown in FIG. 6 has the three-phase AC power source 1, the converter 2, the smoothing capacitor 3, the inverter 4, the permanent magnet synchronous motor 5, the driven object 6, a temperature detection device 100, a memory 22 and an upper control device 23. The temperature detection device 100 has the current detection unit 11, the iron loss estimation unit 12, the rotor temperature estimation unit 13, the winding temperature estimation unit 14 and an alarm generation unit 15.

A reference value $T_t$ used to determine whether or not the rotor 52 is in the overheating state is stored in the memory 22. The temperature $T_r$ of the rotor 52 is supplied from the rotor temperature estimation unit 13 to the alarm generation unit 15. Then, the alarm generation unit 15 reads the reference value $T_t$ from the memory 22 and when the temperature $T_r$ of the rotor 52 is higher than the reference value $T_t$, generates an alarm signal $S_a$ to report that the rotor 52 is in the overheating state and supplies the alarm signal $S_a$ to the upper control device 23. The upper control device 23 includes a CNC (computer numerical control), etc., and stops the operation of the permanent magnet synchronous motor 5 when the alarm signal $S_a$ is supplied from the alarm generation unit 15.

Figure 7:
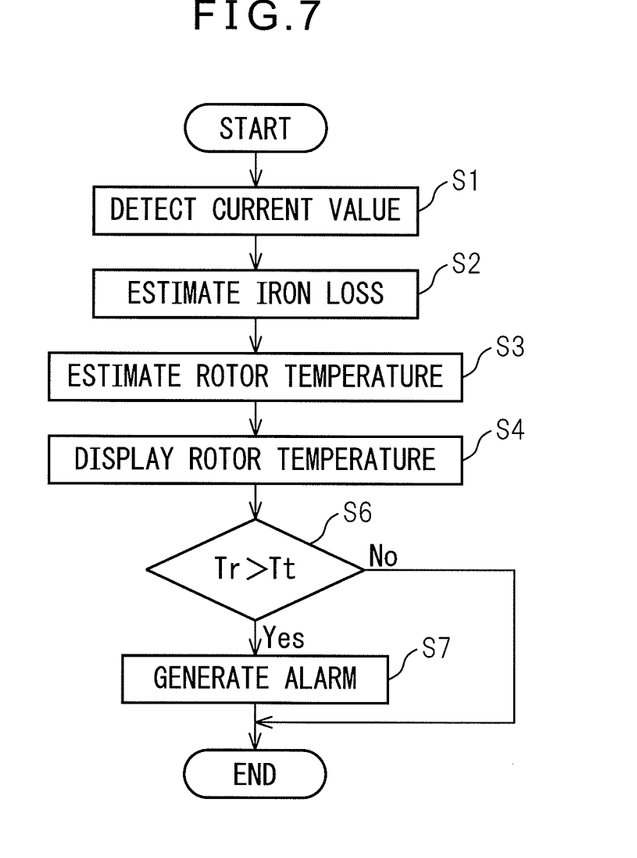
FIG. 7 is a flowchart of an operation of the temperature detection device of the fourth embodiment of the present invention.

FIG. 7 is a flowchart of the operation of the temperature detection device of the fourth embodiment of the present invention. In the flowchart in FIG. 7, in step S6 after step S4, the alarm generation unit 15 determines whether or not the temperature $T_r$ of the rotor 52 is higher than the value $T_t$. When the temperature $T_r$ of the rotor 52 is higher than the value $T_t$, the alarm generation unit 15 generates the alarm signal $S_a$ in step S7, supplies the alarm signal $S_a$ to the upper control device 23, and exits the processing. On the other hand, when the temperature $T_r$ of the rotor 52 is not higher than the value $T_t$, the processing is exited.

The present invention is not limited to the embodiments described above and there can be a number of alterations and modifications. For example, in the embodiments described above, the case is explained where the three-phase AC power source is used as an AC power source, however, the AC power source is not limited to the three-phase AC power source.

Further, in the embodiments described above, the case where the rotary servomotor is used as a motor is explained, however, it is also possible to apply the present invention to a case where a permanent magnet synchronous motor, such as a linear servomotor having stator and slider and a vibration servomotor having stator and vibrator, is used and also to apply the present invention to a case where an induction motor is used instead of the synchronous motor.

In the embodiments described above, the case where the iron loss is estimated using the frequency of the alternating current flowing through the winding, the D-phase alternating current value and the Q-phase alternating current value is explained, however, it is also possible to estimate the iron loss using the amplitude and frequency of the alternating current flowing through the winding and the phase of the rotor, and also to estimate the iron loss using a magnetic analysis.

Further, it is also possible to estimate the iron loss using the law of conservation of energy, which states that the electric power to be input to a motor is the sum of the copper loss of the motor, the iron loss of the motor, the mechanical loss of the motor and the output of the motor. The electric power to be input to the motor is the product of the current supplied to the motor and the voltage applied to the motor. It is possible to directly measure the voltage applied to the motor, however, it is also possible to estimate the voltage applied to the motor using the counter electromotive force of the motor, the resistance value of the motor, the inductance value of the motor and the current (for example, D-phase alternating current and Q-phase alternating current) flowing through the motor. As the mechanical loss, a theoretical value of the mechanical loss, an experimental value of the mechanical loss or a predetermined mechanical loss is used. The iron loss estimated in this case is the sum of the iron loss of the stator and the iron loss of the rotor, however, it can be considered that the ratio of the iron loss that occurs in the rotor to the estimated iron loss is constant, and therefore, it is possible to estimate the iron loss of the rotor by multiplying the estimated iron loss by the ratio. It is possible to calculate the ratio theoretically or experimentally, or a given ratio can also be used.

When estimating the iron loss of the rotor, it is also possible to use an approximate equation that can be easily conceived at from equation (1) instead of Equation (1). For example, it is possible to estimate the iron loss based on the following equation:

$$p=\{a|I_q|^\alpha+b|c+I_d|^\alpha\}\omega^2+\{e|I_q|^\beta+f|c+I_d|^\beta\}\omega+x \quad (1)'$$

p: Iron loss
ω: Frequency of an alternating current flowing through the winding
$I_d$: D-phase alternating current value when three-phase alternating current values are dq-converted into two-phase alternating current values
$I_q$: Q-phase alternating current value when three-phase alternating current values are dq-converted into two-phase alternating current values
a, b, c, e, f: Constant
x: Constant that is slightly affected
α, β: Exponent In the third embodiment described above, the case where the temperature of the winding is estimated using the temperature of the rotor is explained, however, it is also possible to estimate the temperature of the winding without using the temperature of the rotor. In this case, the temperature of the winding is estimated based on the following equation:

$$T_c(t+\Delta t) = T_c(t) + \frac{Q(t) - k(T_c(t) - T_s)}{C}\Delta t \quad (4)'$$

t, Δt, t+Δt: Time during which an alternating current is applied to the motor
$T_c(t)$: Temperature of the winding at time t
$T_c(t+\Delta t)$: Temperature of the winding at time t+Δt
Q(t): Copper loss at time t
$T_s$: Ambient temperature of the motor
k, C: Constant determined by the shape and material of the motor and the cooling conditions of the stator Further, in the first to third embodiments described above, it is also possible to generate an alarm as in the fourth embodiment described above.

As above, the present invention is explained in relation to the preferred embodiments, however, it should be understood by a person skilled in the art that various alterations and modification can be made without deviating from the scope disclosed by claims, as described later.

The invention claimed is:

1. A temperature detection device that detects a temperature of a rotor of a motor, having:
a current detection unit configured to detect a current value of a current flowing through a winding with which any one of a stator and the rotor of said motor is provided;
an iron loss estimation unit configured to estimate an iron loss of said rotor using said current value; and
a rotor temperature estimation unit configured to estimate the temperature of said rotor using said iron loss.

2. The temperature detection device according to claim 1, further having:
a winding temperature estimation unit configured to estimate the temperature of said winding, wherein
said rotor temperature estimation unit estimates the temperature of the rotor using the iron loss and the temperature of said winding.

3. The temperature detection device according to claim 2, wherein
said stator is provided with said winding, and
said winding temperature estimation unit is a temperature detection element arranged on the periphery of said winding.

4. The temperature detection device according to claim 2, wherein
said winding temperature estimation unit estimates a copper loss of said winding from said current value and calculates an amount of a rise in the temperature of the winding from said copper loss.

5. The temperature detection device according to claim 1, wherein
said stator is provided with three windings to which U-phase, V-phase and W-phase alternating currents of three-phase alternating currents are supplied, respectively, and
said iron loss estimation unit estimates the iron loss of said rotor based on the following equation:

$$p=\{a|I_q|^\alpha+b|c+I_d|^\alpha\}\omega^2+\{e|I_q|^\beta+f|c+I_d|^\beta\}\omega$$

p: Iron loss of the rotor
ω: Frequency of an alternating current flowing through the winding
$I_d$: D-phase alternating current value when three-phase alternating current values are dq-converted into two-phase alternating current values
$I_q$: Q-phase alternating current value when three-phase alternating current values are dq-converted into two-phase alternating current values
a, b, c, e, f: Constant
α, β: Exponent.

6. The temperature detection device according to claim 2, wherein
said stator is provided with three windings to which U-phase, V-phase and W-phase alternating currents of three-phase alternating currents are supplied, respectively, and
said iron loss estimation unit estimates the iron loss of said rotor based on the following equation:

$$p=\{a|I_q|^\alpha+b|c+I_d|^\alpha\}\omega^2+\{e|I_q|^\beta+f|c+I_d|^\beta\}\omega$$

p: Iron loss of the rotor
ω: Frequency of an alternating current flowing through the winding
$I_d$: D-phase alternating current value when three-phase alternating current values are dq-converted into two-phase alternating current values
$I_q$: Q-phase alternating current value when three-phase alternating current values are dq-converted into two-phase alternating current values
a, b, c, e, f: Constant
α, β: Exponent
and said rotor temperature estimation unit estimates an amount of a rise in the temperature of said rotor using said iron loss, the temperature of the winding, and the temperature of said rotor.

7. The temperature detection device according to claim 1, further having:
an alarm generation unit configured to generate an alarm when the temperature estimated by said rotor temperature estimation unit exceeds a predetermined temperature.

8. The temperature detection device according to claim 1, wherein
said motor is a synchronous motor.

* * * * *